(12) United States Patent
Su et al.

(10) Patent No.: US 11,764,328 B2
(45) Date of Patent: Sep. 19, 2023

(54) LIGHT-EMITTING DIODE PACKAGE HAVING BUMP FORMED IN WRIGGLE SHAPE

(71) Applicant: EPISTAR CORPORATION, Hsinchu (TW)

(72) Inventors: Ying-Yong Su, Hsinchu (TW);
Hsin-Mao Liu, Hsinchu (TW);
Wei-Shan Hu, Hsinchu (TW);
Ching-Tai Cheng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 183 days.

(21) Appl. No.: 16/539,539

(22) Filed: Aug. 13, 2019

(65) Prior Publication Data
US 2021/0050478 A1 Feb. 18, 2021

(51) Int. Cl.
*H01L 33/38* (2010.01)
*H01L 33/20* (2010.01)

(52) U.S. Cl.
CPC ............. *H01L 33/20* (2013.01); *H01L 33/38* (2013.01)

(58) Field of Classification Search
CPC ........... H01L 33/38–387; H01L 33/642; H01L 33/22; H01L 33/382; H01L 33/405; H01L 2933/0016; H01L 33/20
USPC ............ 257/91, 99, 33.062, 33.065, 33.066, 257/33.067, 33.074; 438/26, 29
See application file for complete search history.

(56) References Cited

U.S. PATENT DOCUMENTS

| | | | | |
|---|---|---|---|---|
| 2010/0051994 A1* | 3/2010 | Katsuno | ................ | H01L 33/387 257/E33.061 |
| 2010/0051995 A1* | 3/2010 | Katsuno | .................. | H01L 33/10 257/98 |
| 2010/0140640 A1* | 6/2010 | Shimokawa | .......... | H01L 33/507 257/98 |
| 2011/0049550 A1* | 3/2011 | Katsuno | .................. | H01L 33/46 257/E33.061 |
| 2013/0032839 A1* | 2/2013 | Shen | ....................... | H01L 33/22 257/98 |
| 2013/0277706 A1* | 10/2013 | Chen | ...................... | H01L 33/486 257/99 |
| 2013/0285101 A1* | 10/2013 | Sugizaki | ................. | H01L 33/62 257/98 |
| 2014/0084317 A1* | 3/2014 | Lee | ......................... | H01L 33/58 257/98 |
| 2017/0069681 A1* | 3/2017 | Lee | ........................ | H01L 27/153 |
| 2017/0207375 A1* | 7/2017 | Lu | .......................... | H01L 25/167 |

(Continued)

*Primary Examiner* — David Chen
(74) *Attorney, Agent, or Firm* — DITTHAVONG, STEINER, & MLOTKOWSKI

(57) ABSTRACT

The light-emitting diode package includes a plurality of bumps being a couple corresponding to each other. Each of the bumps has a first part and a second part placed under the first part, and a gap is formed between the bumps in a period-repeating wriggle shape or an irregular wriggle shape. Accordingly, the distance between the bumps of the light-emitting diode package is small, which results in a less stress being concentrated at the space between the bumps, as a result, a crack is difficultly caused by the stress to the light-emitting diode package, in other words, the structural strength between the bumps and the covering part is enhanced. Still, while being manufactured, the yield rate of the light-emitting diode package is also improved since there is almost no crack to reduce the yield rate.

17 Claims, 16 Drawing Sheets

(56) References Cited

U.S. PATENT DOCUMENTS

2017/0373226 A1* 12/2017 Chen ................. H01L 33/405
2018/0212110 A1*  7/2018 Chen ................. H01L 33/22
2018/0340681 A1* 11/2018 Cok .................. F21V 19/0025

* cited by examiner

LIGHT-EMITTING DIODE PACKAGE HAVING BUMP FORMED IN WRIGGLE SHAPE

BACKGROUND OF THE DISCLOSURE

Field of the Disclosure

The present disclosure is related to a light-emitting diode package having a bare chip without a growth substrate, and more particularly to a compact light-emitting diode package with high yield rate.

Description of the Prior Art

The substrate of traditional light-emitting diode (LED) package has its characteristics, such as low heat dissipating rate, large emitting angle and so on. Therefore, new type LED package is developed as required, which is sometimes called thin film LED package. Since having no growth substrate, the thin film LED package is thin and has smaller emitting angle than the traditional type. However, the distance between the bumps of the thin film LED package is large, which results in a stress being concentrated at the space between one bump to the other one, therefore, a crack is caused by the stress to the thin film LED package. The crack also reduces the yield rate of thin film LED package during the manufacture.

SUMMARY OF THE DISCLOSURE

Therefore, in order to solve the above-mentioned problems, the present disclosure is to provide a light-emitting diode package that substantially obviates the drawbacks of the related conventional art.

A primary objective of the present disclosure is to provide a light-emitting diode package, in which a gap is formed between a pair of bumps in a period-repeating wriggle shape or an irregular wriggle shape.

Another primary objective of the present disclosure is to provide a light-emitting diode package with high structural strength and high yield rate.

Still another primary objective of the present disclosure is to provide a light-emitting diode package, in which the lateral surface/edge of the first part of one bump is formed together with the adjacent lateral surface/edge of the first part of the other bump in a period-repeating wriggle shape or an irregular wriggle shape.

Yet another primary objective of the present disclosure is to provide a light-emitting diode package, in which the surrounding of each of the first parts, the adjacent lateral surfaces of one second part and the other adjacent second part, and the surrounding of each of the second parts are formed in a period-repeating wriggle shape or an irregular wriggle shape.

According to above objectives, the present disclosure provides a light-emitting diode package, comprising a plurality of bumps being a couple corresponding to each other. Each of the bumps has a first part and a second placed under the first part, and the horizontal width of the first part is larger than the horizontal width of the second part; an LED chip placed on the bumps; a covering part which covers the bumps; and a plurality of plates, each of the bumps is placed on respective plates, and a gap is formed between the couple of bumps.

Since the distance between the bumps of the light-emitting diode package is small, which results in a stress hardly being concentrated at the space between the bumps, as a result, a crack is difficultly caused by the stress to the light-emitting diode package. While being manufactured, the yield rate of the light-emitting diode package is improved since there is almost no crack to reduce the yield rate. Still, the lateral surface/edge of the first part of one bump is formed together with the adjacent lateral surface of the first part of the other bump in a period-repeating wriggle shape or an irregular wriggle shape, so that the structural strength between the bumps and the covering part is enhanced.

BRIEF DESCRIPTION OF THE DRAWINGS

The disclosure as well as a preferred mode of use, further features and advantages thereof will best be understood by reference to the following detailed description of the illustrative embodiments when reading in conjunction with the accompanying drawings, wherein.

DETAILED DESCRIPTION OF THE PREFERRED EMBODIMENTS

The present disclosure discloses a light-emitting diode package. The drawings referred in the following are not made according to the actual related sizes, and the function of these drawings is only for illustrating characteristics related to the present disclosure.

Figure 1A:
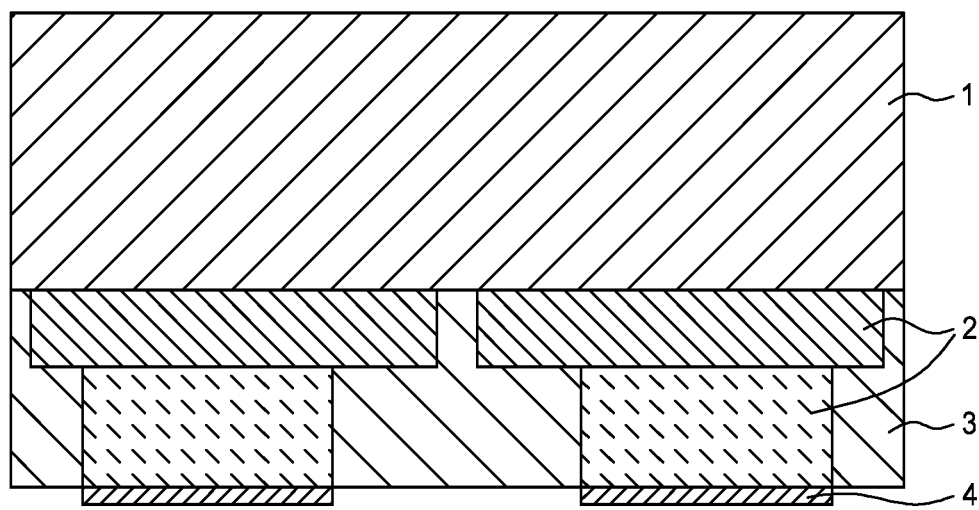
FIG. 1 is a cross sectional view of the light-emitting diode package according to a first preferred embodiment of the present disclosure.

FIG. 1 is a cross sectional view of the light-emitting diode package according to a first preferred embodiment of the present disclosure. The light-emitting diode package I1 includes an LED chip 1, a plurality of bumps 2, a covering part 3, and a plurality of plates 4. The LED chip 1 is placed on the bumps 2. The bumps 2 are covered by the covering part 3. Each of the bumps 2 is connected to respective plates 4. The material of the bumps 2 is, for example, Cu, Ni, Cr, Sn or Ag. The foregoing material of the bumps 2 is an example. The material of the covering part 3 is, for example, epoxy or silicone. The foregoing material of the covering part 3 is an example. The material of the plates 4 is, for example, NiAu. The foregoing material of the plates 4 is an example.

Figure 2A:
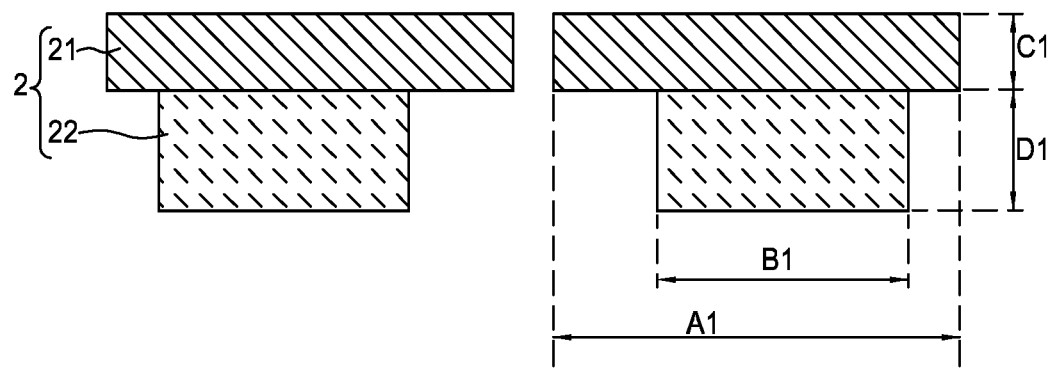
FIG. 2A is a cross sectional view of the bumps of the light-emitting diode package according to a first preferred embodiment of the present disclosure.
Figure 2B:
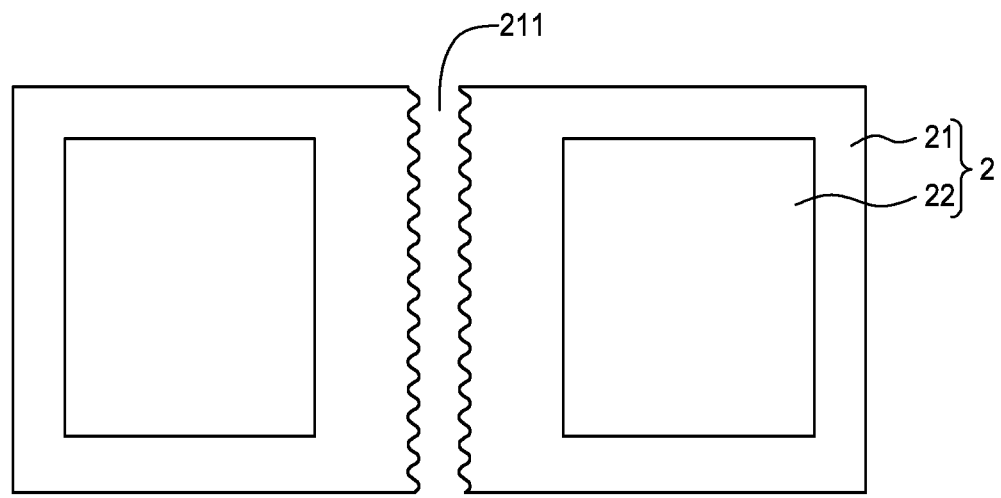
FIG. 2B is a bottom view of the bumps of the light-emitting diode package according to a first preferred embodiment of the present disclosure.

Please refer to FIG. 2A, FIG. 2A is a cross sectional view of the bumps of the light-emitting diode package according to a first preferred embodiment of the present disclosure. The bumps 2 of the present disclosure are for example a couple corresponding to each other. Each of the bumps 2 includes a first part 21 and a second part 22. The horizontal width A1 of the first part 21 is larger than the horizontal width B1 of the second part 22. The vertical height C1 of the first part 21 is smaller than the vertical height D1 of the second part 22. The first part 21 is placed on the second part 22. Please further refer to FIG. 2B, a bottom view of the bumps of the light-emitting diode package according to a first preferred embodiment of the present disclosure. The lateral surface/edge of the first part 21 of one bump 2 is formed together with the adjacent lateral surface/edge of the first part 21 of the other bump 2 in a period-repeating wriggle shape, which results in forming a gap 211 between the bumps 2 a couple corresponding to each other. The width of the foregoing gap is between 1 um and 30 um. The ratio of the width to the vertical height C1 is between 0.5 and 2.0.

Figure 3:
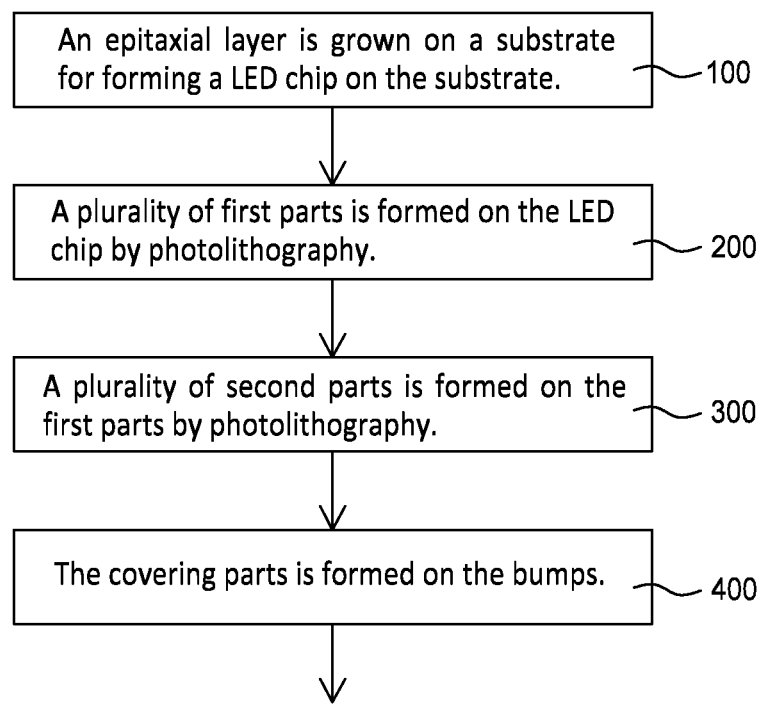
FIG. 3 is a flow chart of steps of manufacturing the light-emitting diode package according to a first preferred embodiment of the present disclosure.
Figure 3:
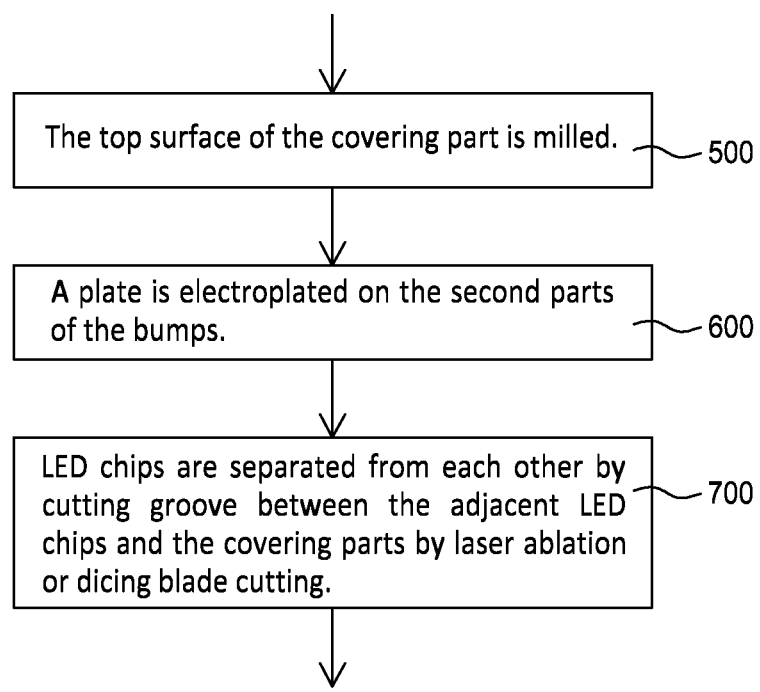
Figure 3:
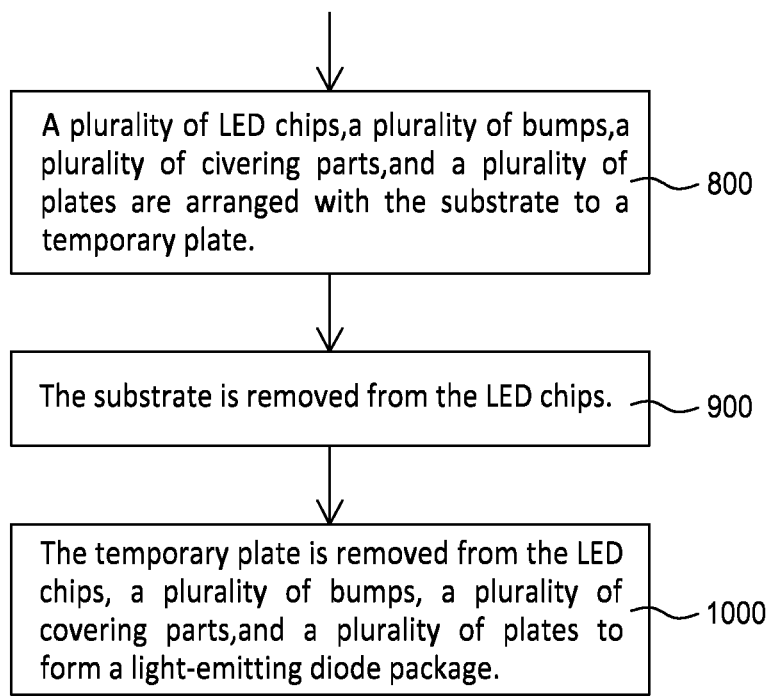
Figure 4A:
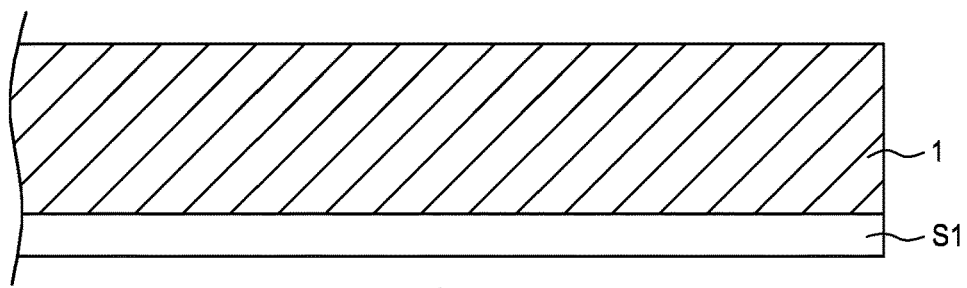
FIGS. 4A-4J show steps of manufacturing the light-emitting diode package according to a first preferred embodiment of the present disclosure.
Figure 4B:
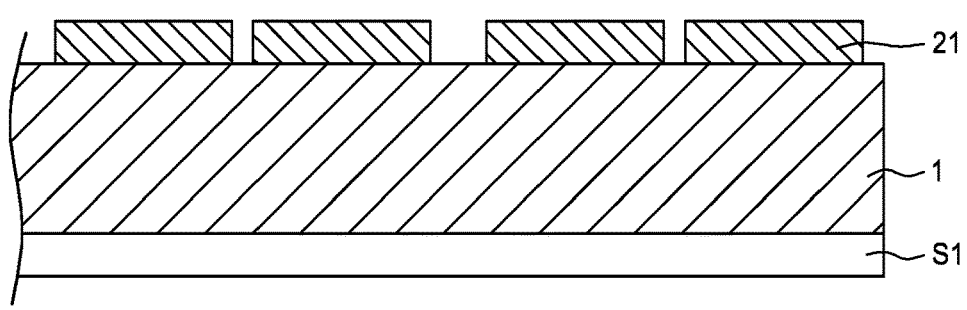
Figure 4C:
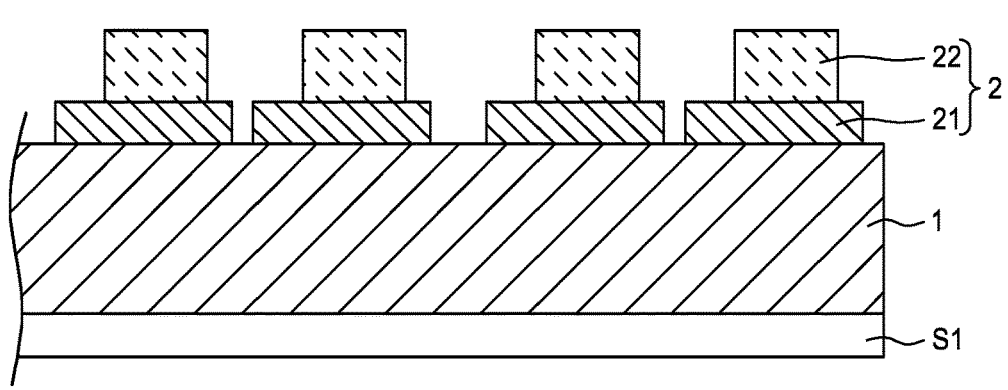
Figure 4D:
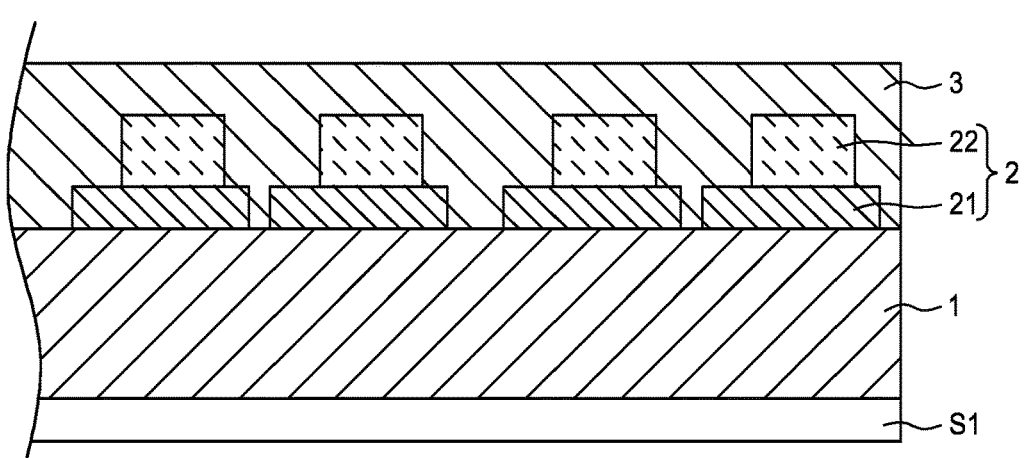
Figure 4E:
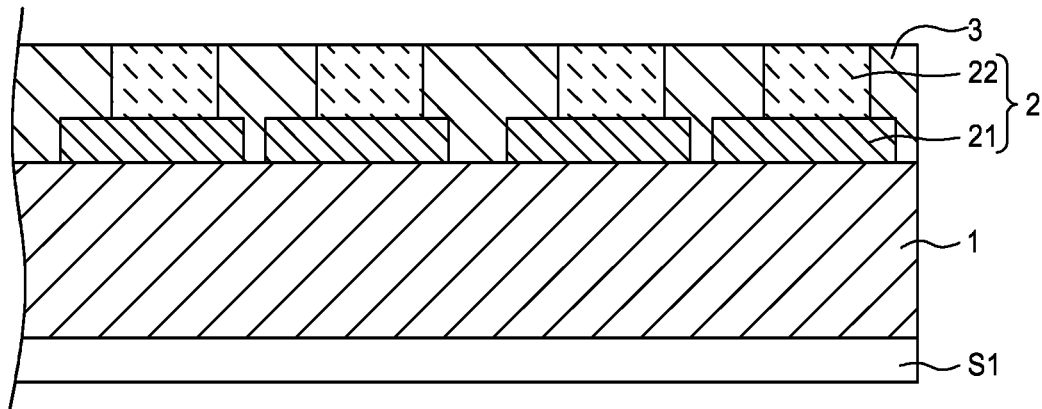
Figure 4F:
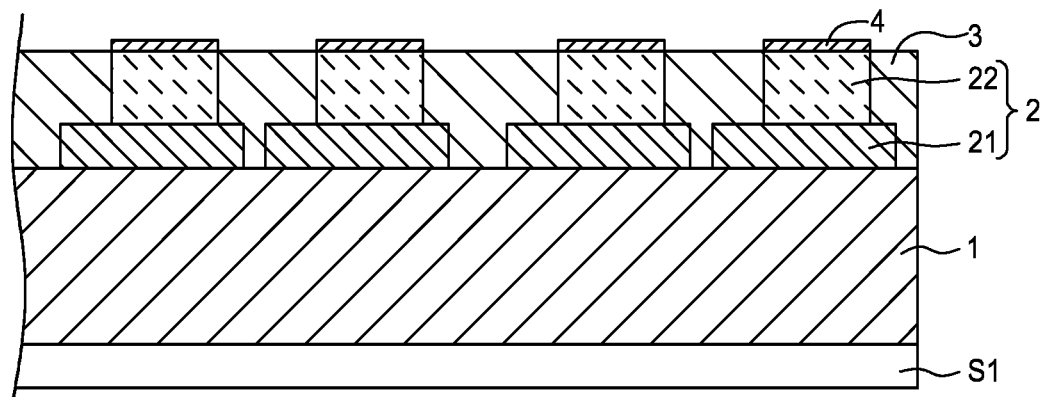
Figure 4G:
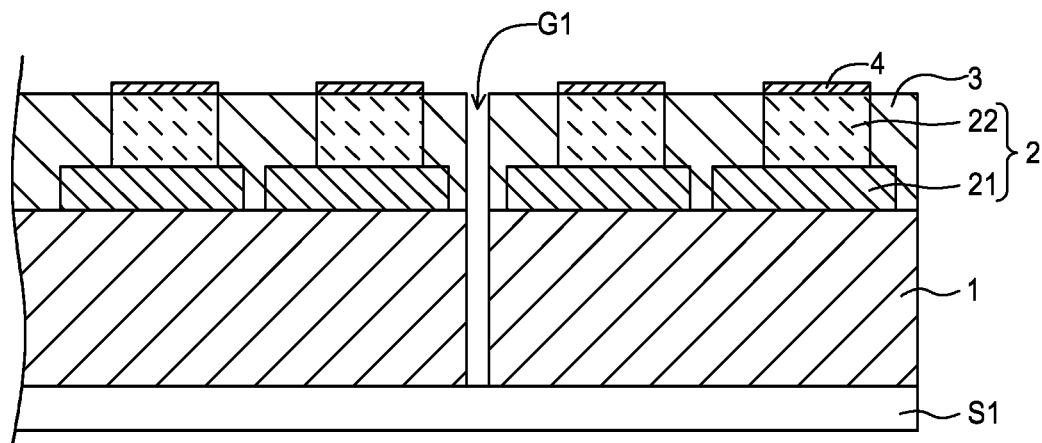
Figure 4H:
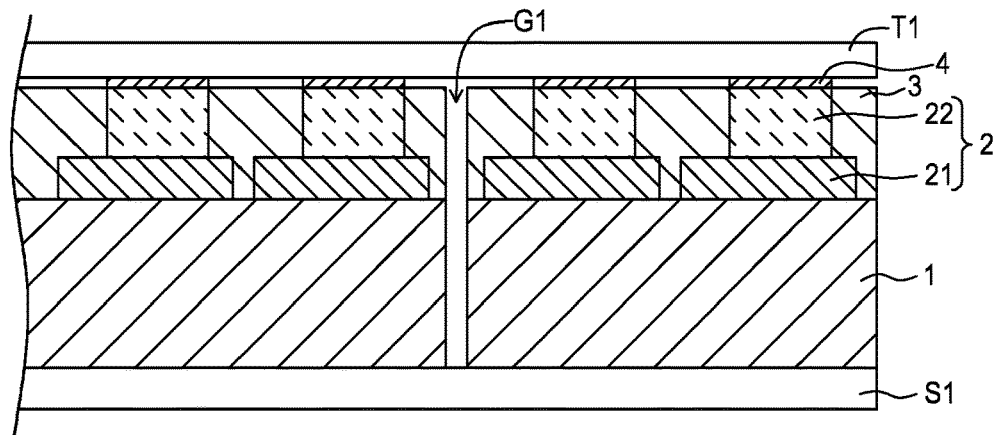
Figure 4I:
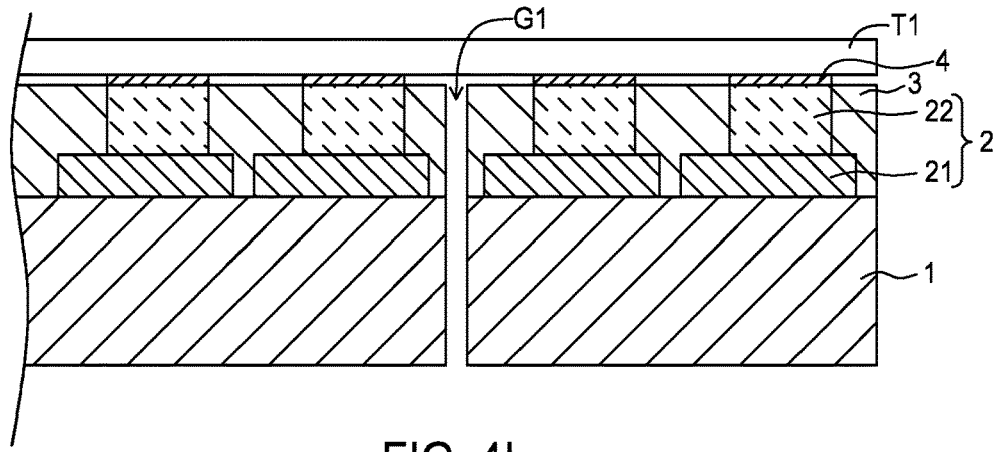
Figure 4J:
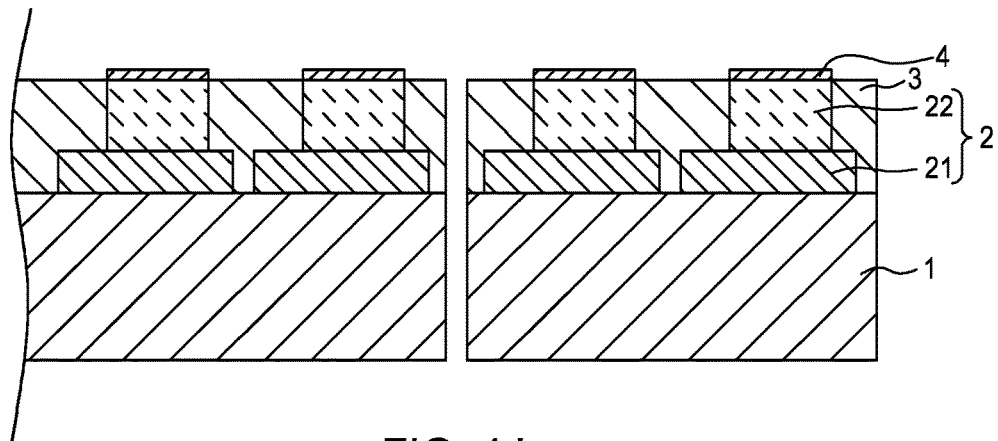

FIG. 3 is a flow chart of steps of manufacturing the light-emitting diode package according to a first preferred embodiment of the present disclosure. FIGS. 4A~4J show the steps of manufacturing the light-emitting diode package according to a first preferred embodiment of the present disclosure. The steps of manufacturing a first preferred embodiment are as follows:

Step 100: Progressing an epitaxy-growing step. An epitaxial layer is grown on a substrate S1 for forming a LED chip 1 on the substrate. The material of the substrate S1 is, for example, Sapphire, GaN, AlN, Ga2O3 or Si. The foregoing material of the substrate S1 is an example. The step 100 is corresponding to FIG. 4A.

Step 200: Progressing a first photolithography step. A plurality of first parts 21 is formed on the LED chip 1 by photolithography. The step 200 is corresponding to FIG. 4B.

Step 300: Progressing a second photolithography step. A plurality of second parts 22 is formed on the first parts 21 by photolithography. A first part 21 and a second part 22 integrally form a bump 2. The step 300 is corresponding to FIG. 4C.

Step 400: Progressing a covering step. The covering part 3 is formed on the bumps 2. The material of the covering part 3 is, for example, epoxy or silicone. The foregoing material of the covering part 3 is an example. The step 400 is corresponding to FIG. 4D.

Step 500: Progressing a milling step. The top surface of the covering part 3 is milled, for example, 10 um to 1000 um of the covering part 3 is grinded off, for reducing vertical height of the covering part 3. As a result, the top surface of each of the second parts 22 is flush with the top surface of covering part 3. The step 500 is corresponding to FIG. 4E.

Step 600: Progressing a plating step. A plate 4 is electroplated on the second parts 22 of the bumps 2. The material of the plates 4 is, for example, NiAu. The foregoing material of the plates 4 is an example, not a limit. The step 600 is corresponding to FIG. 4F.

Step 700: Progressing a dicing step. LED chips are separated from each other by cutting groove G1 between the adjacent LED chips 1 and the covering parts 3 by laser ablation or dicing blade cutting. The step 700 is corresponding to FIG. 4G.

Step 800: Progressing an arranging step. A plurality of LED chips 1, a plurality of bumps 2, a plurality of covering parts 3, and a plurality of plates 4 are arranged with the substrate 1 to a temporary plate T1. The step 800 is corresponding to FIG. 4H.

Step 900: Progressing a first removing step. The substrate 1 is removed from the LED chips 1. The step 900 is corresponding to FIG. 4I.

Step 1000: Progressing a second removing step. The temporary plate T1 is removed from the LED chips 1, a plurality of bumps 2, a plurality of covering parts 3, and a plurality of plates 4 to form a light-emitting diode package I1 having a LED chip 1, a plurality of bumps 2, a covering part 3, and a plurality of plates 4. The step 1000 is corresponding to FIG. 4J.

Figure 5:
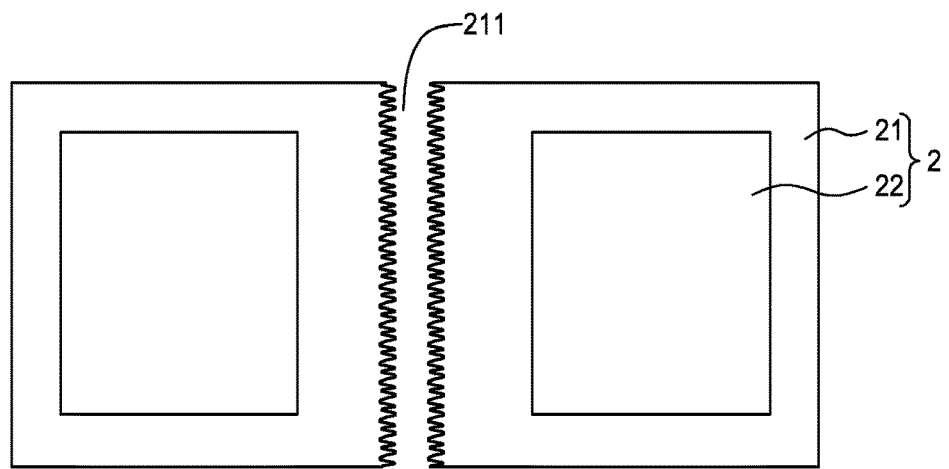
FIG. 5 is a bottom view of the bumps of the light-emitting diode package according to a second preferred embodiment of the present disclosure.

Please refer to FIG. 5, FIG. 5 is a bottom view of the bumps of the light-emitting diode package according to a second preferred embodiment of the present disclosure. The light-emitting diode package includes a LED chip 1 (not shown in FIG. 5), a plurality of bumps 2, a covering part 3 (not shown in FIG. 5), and a plurality of plates 4 (not shown in FIG. 5), with the relative positions similar to the light-emitting diode package according to the first preferred embodiment of the present disclosure. In the present embodiment, the lateral surface/edge of the first part 21 of one bump 2 is formed together with the adjacent lateral surface/edge of the first part 21 of the other bump 2 in irregular wriggle shape, which results in forming a gap 211 between the bumps 2. The width of the foregoing gap 211 is between 1 um and 30 um.

Figure 6:
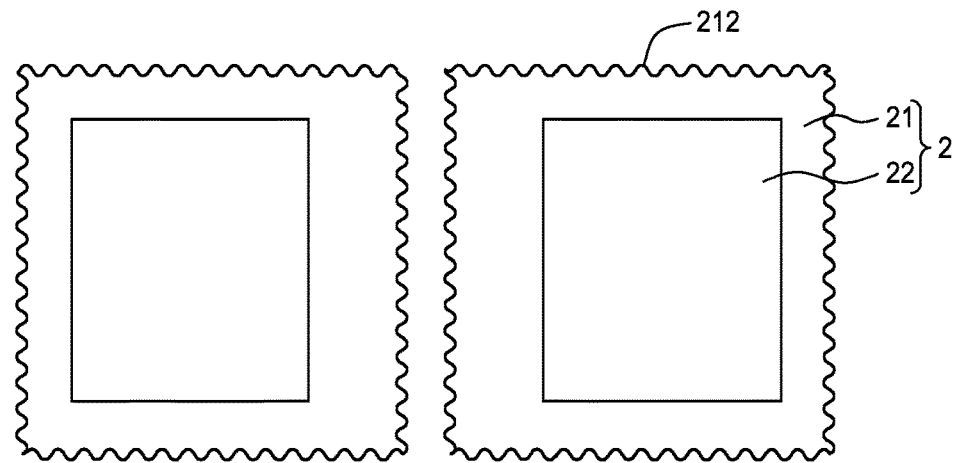
FIG. 6 is a bottom view of the bumps of the light-emitting diode package according to a third preferred embodiment of the present disclosure.

Please refer to FIG. 6, FIG. 6 is a bottom view of the bumps of the light-emitting diode package according to a third preferred embodiment of the present disclosure. The light-emitting diode package includes a LED chip 1 (not shown in FIG. 6), a plurality of bumps 2, a covering part 3 (not shown in FIG. 6), and a plurality of plates 4 (not shown in FIG. 6), with the relative positions similar to the light-emitting diode package according to the first preferred embodiment of the present disclosure. The lateral surface/edge of the first part 21 of one bump 2 is formed together with the adjacent lateral surface/edge of the first part 21 of the other bump 2 in a period-repeating wriggle shape, which results in forming a gap 211 between the bumps 2. The width of the foregoing gap 211 is between 1 um and 30 um. In the present embodiment, the surrounding 212 of the first part 21 is formed in a period-repeating wriggle shape.

Figure 7:
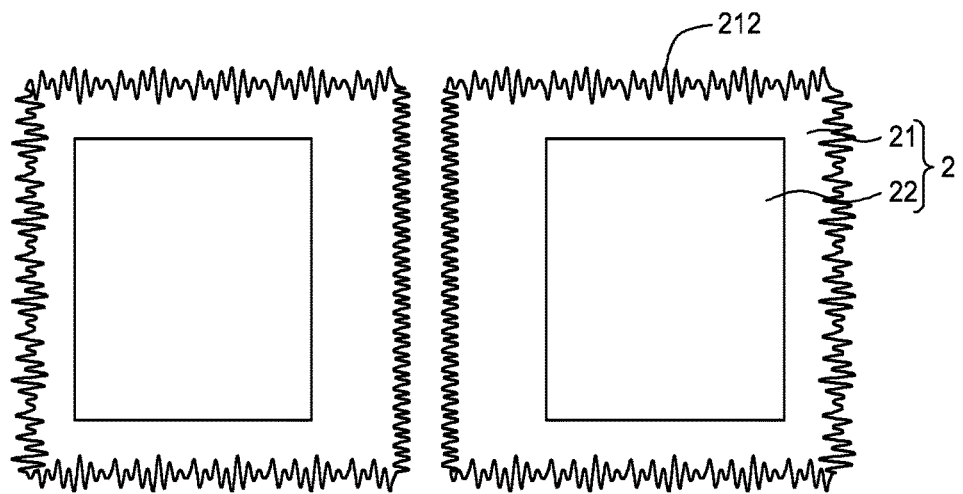
FIG. 7 is a bottom view of the bumps of the light-emitting diode package according to a fourth preferred embodiment of the present disclosure.

Please refer to FIG. 7, FIG. 7 is a bottom view of the bumps of the light-emitting diode package according to a fourth preferred embodiment of the present disclosure. The light-emitting diode package includes a LED chip 1 (not shown in FIG. 7), a plurality of bumps 2, a covering part 3 (not shown in FIG. 7), and a plurality of plates 4 (not shown in FIG. 7), with the relative positions similar to the light-emitting diode package according to the first preferred embodiment of the present disclosure. The lateral surface/edge of the first part 21 of one bump 2 is formed together with the adjacent lateral surface/edge of the first part 21 of the other bump 2 in an irregular wriggle shape, which results in forming a gap 211 between the bumps 2. The width of the foregoing gap 211 is between 1 um and 30 um. Still, the surrounding 212 of the first part 21 is formed in an irregular wriggle shape.

Figure 8:
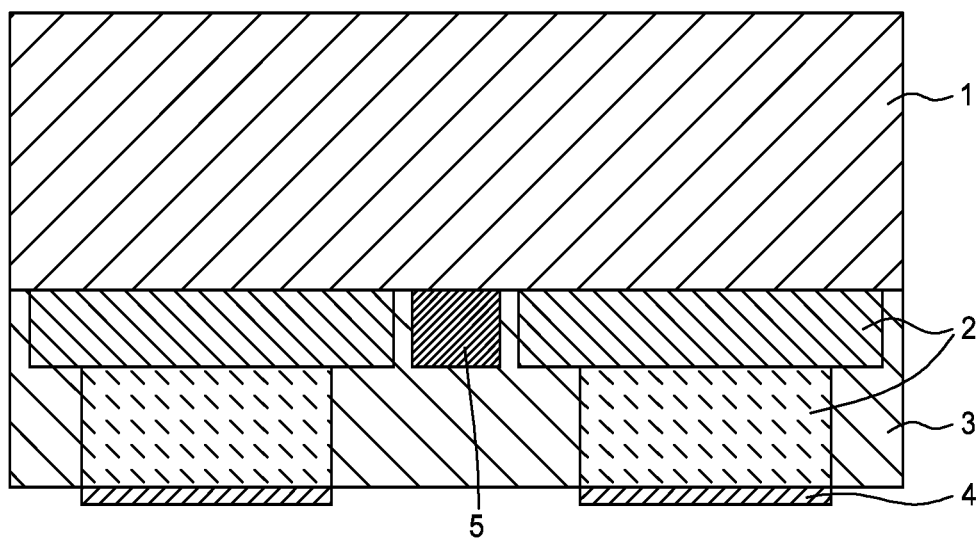
FIG. 8 is a cross sectional view of the light-emitting diode package according to a fifth preferred embodiment of the present disclosure.

FIG. 8 is a cross sectional view of the light-emitting diode package according to a fifth preferred embodiment of the present disclosure. The light-emitting diode package 15 includes a LED chip 1, a plurality of bumps 2, a covering part 3, a plurality of plates 4 and a protecting part 5. The bumps 2 and the protecting part 5 are formed under the LED chip 1. The protecting part 5 is arranged between the bumps 2. The bumps 2 are covered by the covering part 3. The plates 4 are formed under the bumps 2, respectively. The material of the bumps 2 is, for example, Cu, Ni, Cr, Sn or Ag. The foregoing material of the bumps 2 is an example. The material of the covering part 3 is, for example, epoxy or silicone. The foregoing material of the covering part 3 is an example. The material of the plates 4 is, for example, NiAu. The foregoing material of the plates 4 is an example. The material of the protecting part 5 is, for example, Cu. Ni, Cr, Sn or Ag. The foregoing material of the protecting part 5 is an example.

Figure 9A:
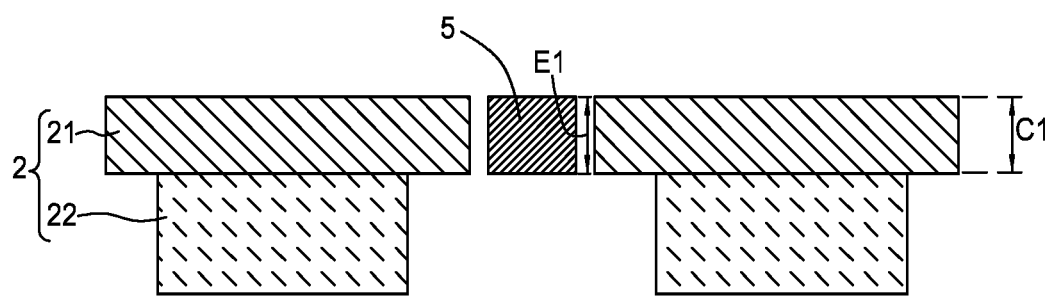
FIG. 9A is a cross sectional view of the bumps and the protecting part of the light-emitting diode package according to a fifth preferred embodiment of the present disclosure.
Figure 9B:
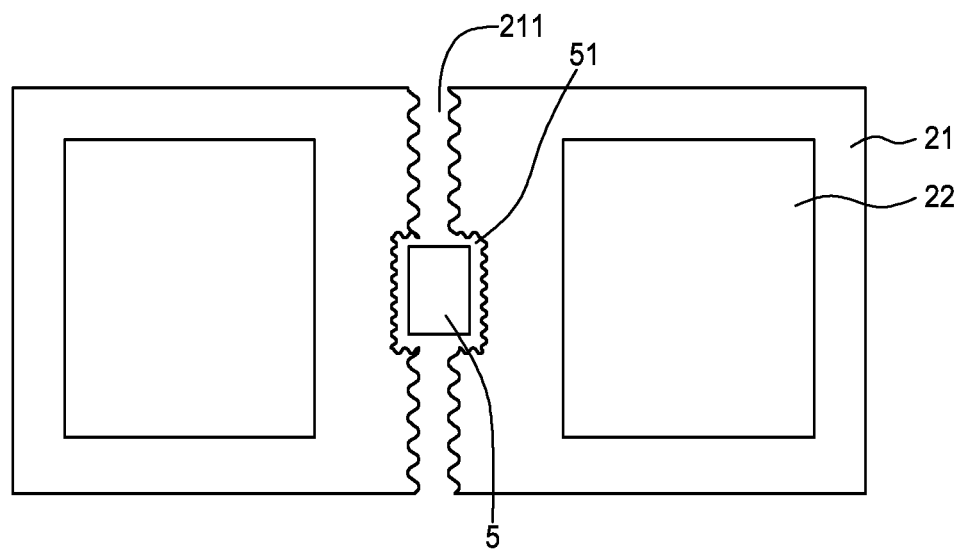
FIG. 9B is a bottom view of the bumps and the protecting part of the light-emitting diode package according to a fifth preferred embodiment of the present disclosure.

Please refer to FIG. 9A, FIG. 9A is a cross sectional view of the bumps and the protecting part of the light-emitting diode package according to a fifth preferred embodiment of the present disclosure. The bumps 2 are for example a couple corresponding to each other. Still, the protecting part 5 is placed between the bumps 2. The vertical height E1 of the protecting part 5 is equal or smaller than the vertical height C1 of the first part 21. Please further refer to FIG. 9B, FIG. 9B is a bottom view of the bumps and the protecting part of the light-emitting diode package according to a fifth preferred embodiment of the present disclosure. The lateral surface/edge of the first part 21 of one bump 2 is formed together with the adjacent lateral surface/edge of the first part 21 of the other bump 2 in a period-repeating wriggle shape, which results in forming a gap 211 between the bumps 2. The width of the foregoing gap 211 is between 1 um and 30 um. Still, an annular gap 51 is formed between the protecting part 5 and each of the bumps 2. The gap 211 is connected to the annular gap 51. The annular gap 51 may be a square annular gap or a circular annular gap (not shown in FIG. 9B). The foregoing shape of the annular gap 51 is an example.

Figure 10:
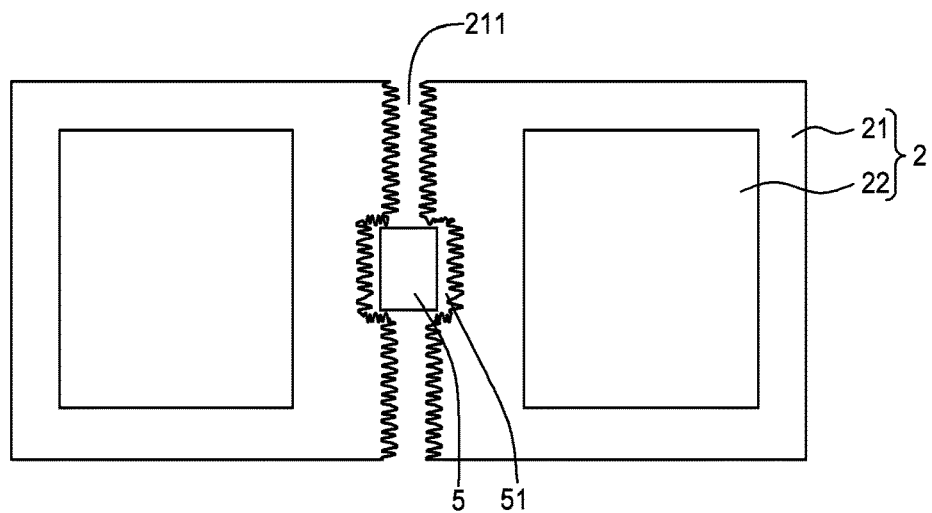
FIG. 10 is a bottom view of the bumps and the protecting part of the light-emitting diode package according to a sixth preferred embodiment of the present disclosure.

Please refer to FIG. 10, FIG. 10 is a bottom view of the bumps and the protecting part of the light-emitting diode package according to a sixth preferred embodiment of the present disclosure. The light-emitting diode package includes a LED chip 1 (not shown in FIG. 10), a plurality of bumps 2, a covering part 3 (not shown in FIG. 10), a plurality of plates 4 (not shown in FIG. 10), and a protecting part 5, and with the similar relative positions to the light-emitting diode package according to the fifth preferred embodiment of the present disclosure. In the present embodiment, the lateral surface/edge of the first part 21 of one bump 2 is formed together with the adjacent lateral surface/edge of the first part 21 of the other bump 2 in an irregular wriggle shape, which results in forming a gap 211 between the bumps 2. Still, the gap 211 is connected to the annular gap 51. The annular gap 51 may be a square annular gap or a circular annular gap (not shown in FIG. 9B). The foregoing shape of the annular gap 51 is an example, not a limit.

Figure 11:
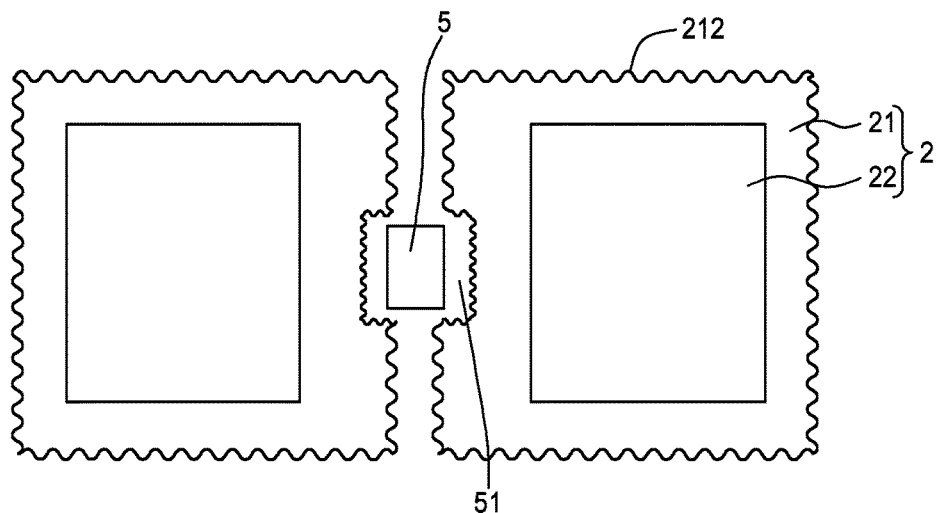
FIG. 11 is a bottom view of the bumps and the protecting part of the light-emitting diode package according to a seventh preferred embodiment of the present disclosure.

Please refer to FIG. 11, FIG. 11 is a bottom view of the bumps and the protecting part of the light-emitting diode package according to a seventh preferred embodiment of the present disclosure. The light-emitting diode package includes a LED chip 1 (not shown in FIG. 11), a plurality of bumps 2, a covering part 3 (not shown in FIG. 11), a plurality of plates 4 (not shown in FIG. 11) and a protecting part 5, with the relative positions similar to the light-emitting diode package according to the fifth preferred embodiment of the present disclosure. In the present embodiment, the surrounding 212 of the first part 21 is formed in a period-repeating wriggle shape.

Figure 12:
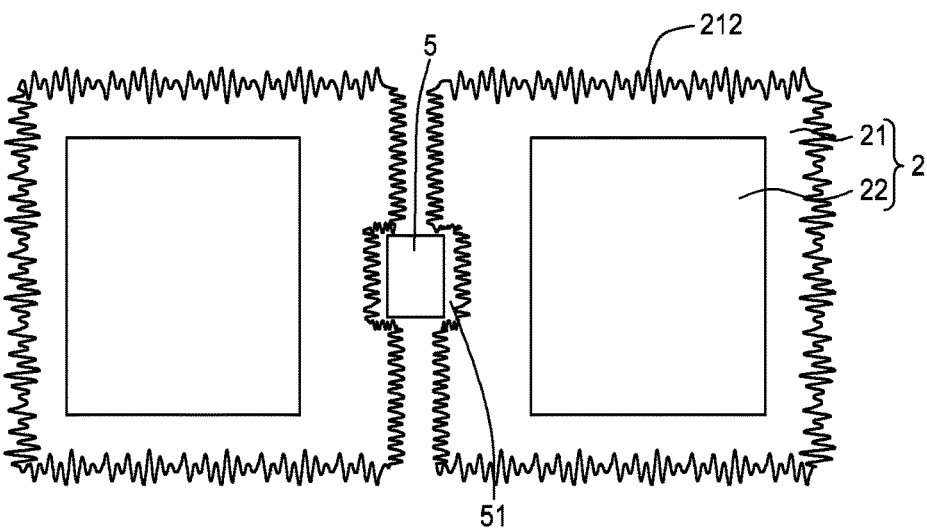
FIG. 12 is a bottom view of the bumps and the protecting part of the light-emitting diode package according to an eighth preferred embodiment of the present disclosure.

Please refer to FIG. 12, FIG. 12 is a bottom view of the bumps and the protecting part of the light-emitting diode package according to an eighth preferred embodiment of the present disclosure. The light-emitting diode package includes a LED chip 1 (not shown in FIG. 12), a plurality of bumps 2, a covering part 3 (not shown in FIG. 12), a plurality of plates 4 (not shown in FIG. 12), and a protecting part 5, with the relative positions similar to the light-emitting diode package according to the fifth preferred embodiment of the present disclosure. In the present disclosure, the surrounding 212 of the first part 21 is formed in an irregular wriggle shape.

Figure 13:
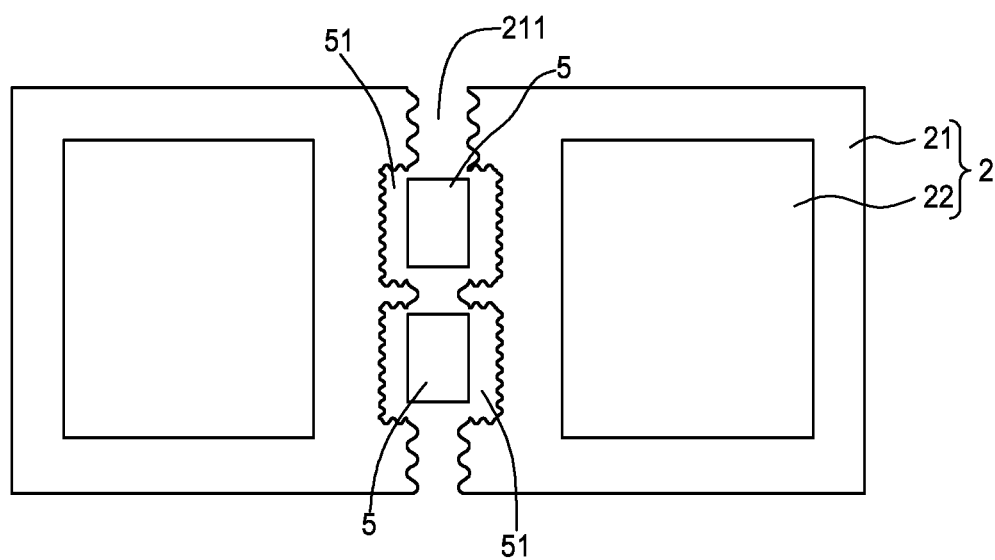
FIG. 13 is a bottom view of the bumps and the protecting part of the light-emitting diode package according to a ninth preferred embodiment of the present disclosure.

Please further refer to FIG. 13, FIG. 13 is a bottom view of the bumps and the protecting part of the light-emitting diode package according to a ninth preferred embodiment of the present disclosure. The light-emitting diode package includes a LED chip 1 (not shown in FIG. 13), a plurality of bumps 2, a covering part 3 (not shown in FIG. 13), a plurality of plates 4 (not shown in FIG. 13) and two protecting parts 5. The LED chip 1 is placed on the bumps 2 and the protecting part 5, with the relative positions similar to the light-emitting diode package according to the fifth preferred embodiment of the present disclosure. In the present embodiment, a plurality of protecting parts 5 is included in the light-emitting diode package. The lateral surface/edge of the first part of one bump 2 is formed together with the adjacent lateral surface/edge of the first part 21 of the other bump 2 in a period-repeating wriggle shape, which results in forming a gap 211 between the bumps 2. The width of the foregoing gap 211 is between 1 um and 30 um. Still, two annular gaps 51 are formed between the protecting parts 5 and each of the bumps 2. The gap 211 is connected to the annular gap 51. The annular gap 51 may be a square annular gap or a circular annular gap (not shown in FIG. 13). The foregoing shape of the annular gap 51 is an example.

Figure 14:
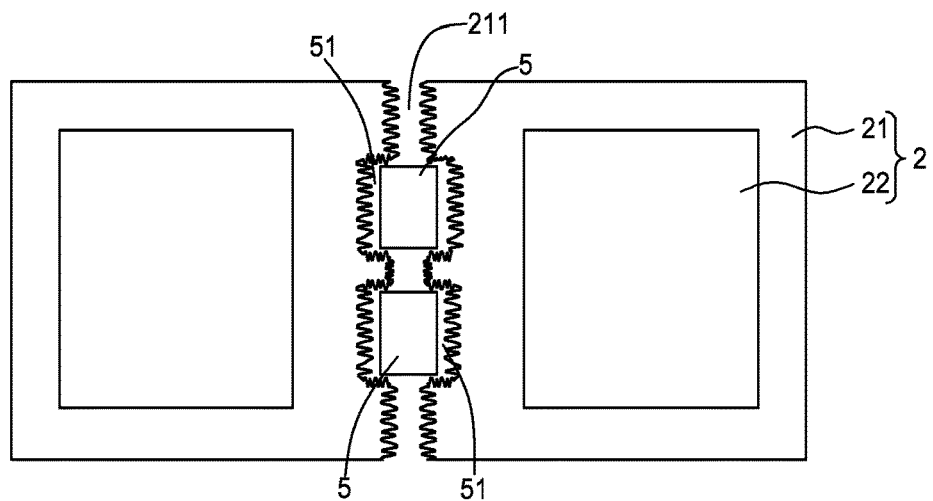
FIG. 14 is a bottom view of the bumps and the protecting part of the light-emitting diode package according to a tenth preferred embodiment of the present disclosure.

Please refer to FIG. 14, FIG. 14 is a bottom view of the bumps and the protecting part of the light-emitting diode package according to a tenth preferred embodiment of the present disclosure. The light-emitting diode package includes a LED chip 1 (not shown in FIG. 14), a plurality of bumps 2, a covering part 3 (not shown in FIG. 14), a plurality of plates 4 (not shown in FIG. 14), and a plurality of protecting parts 5, and with the relative positions similar to the fifth preferred embodiment of the light-emitting diode package according to the present disclosure. In the present embodiment, the lateral surface/edge of the first part 21 of one bump 2 is formed together with the adjacent lateral surface/edge of the first part 21 of the other bump 2 in an irregular wriggle shape, which results in forming a gap 211 between the bumps 2. Still, the gap 211 is connected to the annular gap 51. The annular gap 51 may be a square annular gap or a circular annular gap (not shown in FIG. 14). The foregoing shape of the annular gap 51 is an example.

Figure 15:
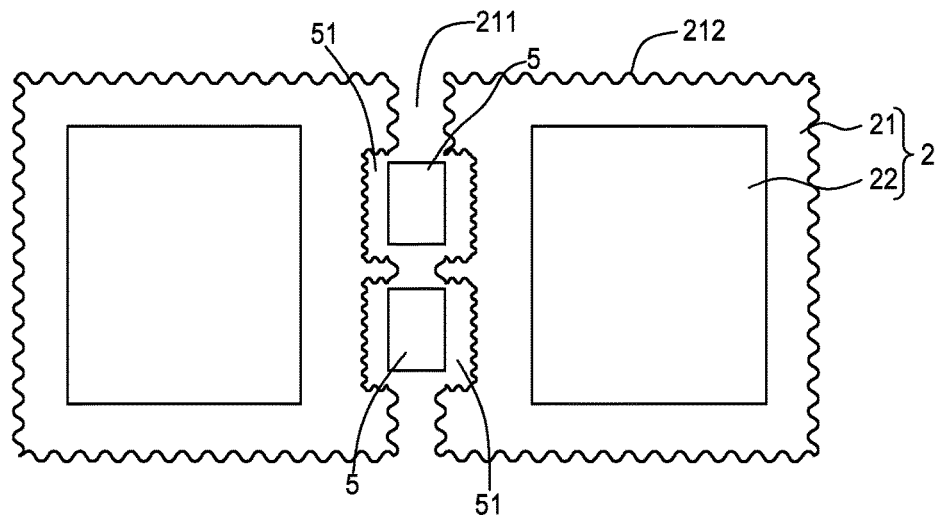
FIG. 15 is a bottom view of the bumps and the protecting part of the light-emitting diode package according to an eleventh preferred embodiment of the present disclosure.

Please refer to FIG. 15, FIG. 15 is a bottom view of the bumps and the protecting part of the light-emitting diode package according to an eleventh preferred embodiment of the present disclosure. The light-emitting diode package includes a LED chip 1 (not shown in FIG. 15), a plurality of bumps 2, a covering part 3 (not shown in FIG. 15), a plurality of plates 4 (not shown in FIG. 15) and a plurality of protecting parts 5, with the relative positions similar to the fifth preferred embodiment of the light-emitting diode package according to the present disclosure. In the present embodiment, the surrounding 212 of the first parts 21 is formed in a period-repeating wriggle shape.

Figure 16:
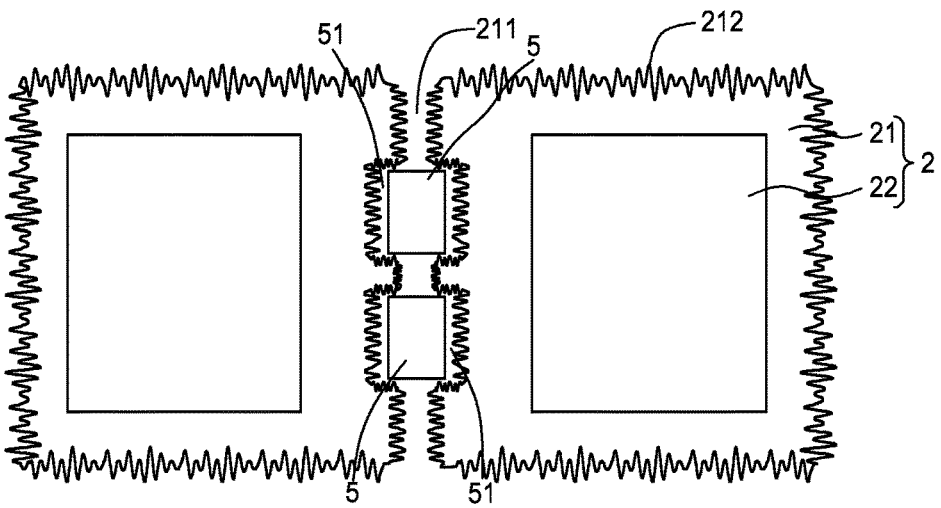
FIG. 16 is a bottom view of the bumps and the protecting part of the light-emitting diode package according to a twelfth preferred embodiment of the present disclosure.

Please refer to FIG. 16, FIG. 16 is a bottom view of the bumps and the protecting part of the light-emitting diode package according to a twelfth preferred embodiment of the present disclosure. The light-emitting diode package includes a LED chip 1 (not shown in FIG. 16), a plurality of bumps 2, a covering part 3 (not shown in FIG. 16), a plurality of plates 4 (not shown in FIG. 16), and a plurality of protecting parts 5, with the relative positions similar to the fifth preferred embodiment of the light-emitting diode package according to the present disclosure. In the present embodiment, the surrounding 212 of the first part 21 is formed in an irregular wriggle shape.

Figure 17A:
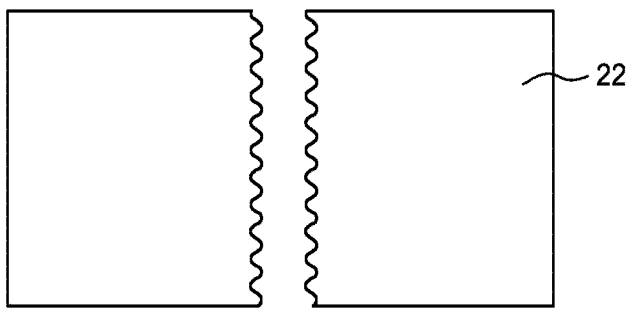
FIG. 17A is a bottom view of the second parts of the light-emitting diode package according to the present disclosure.
Figure 17B:
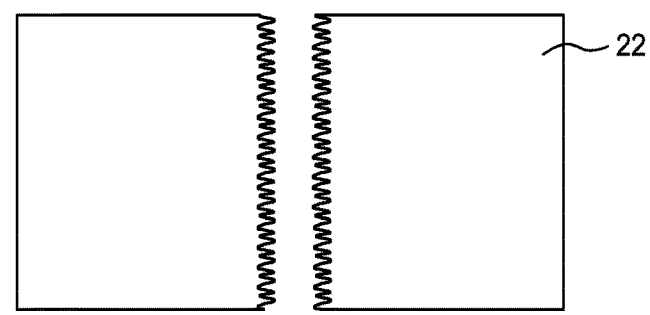
FIG. 17B is a bottom view of the second parts of the light-emitting diode package according to the present disclosure.
Figure 17C:
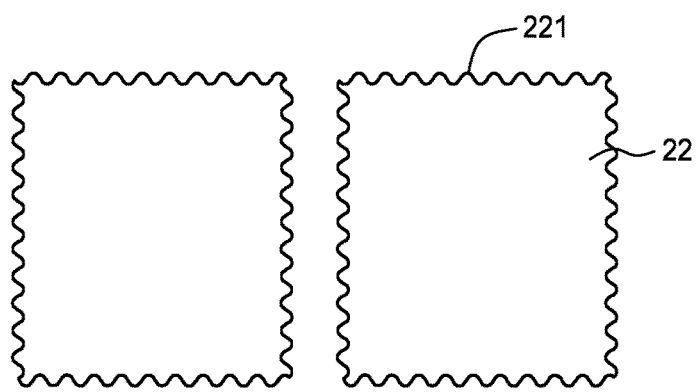
FIG. 17C is a bottom view of the second parts of the light-emitting diode package according to the present disclosure.
Figure 17D:
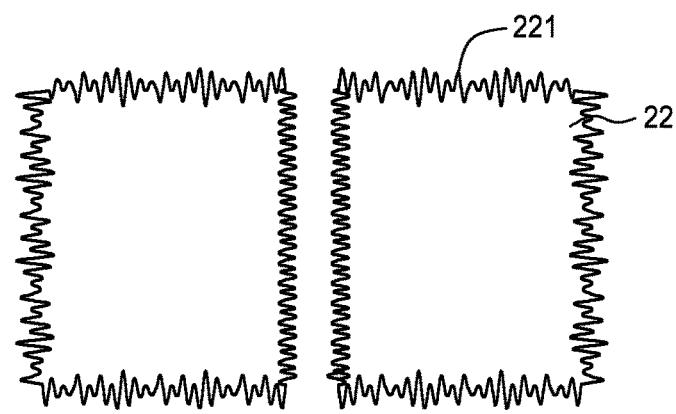
FIG. 17D is a bottom view of the second parts of the light-emitting diode package according to the present disclosure.

Please refer to FIG. 17A, FIG. 17A is a bottom view of the second parts of the light-emitting diode package according to the present disclosure. It is noted here, in the foregoing preferred embodiments, the lateral surface/edge of the second part 22 of one bump 2 may be formed together with the adjacent lateral surface/edge of the second part 22 of the other bump 2 in a period-repeating wriggle shape. Please further refer to FIG. 17B, FIG. 17B is a bottom view of the second parts 22 of the light-emitting diode package according to the present disclosure. It is noted here, in the foregoing preferred embodiments, the lateral surface/edge of the second part 22 of one bump 2 may be formed together with the adjacent lateral surface/edge of the second part 22 of the other bump 2 in an irregular wriggle shape. Please further refer to FIG. 17C, FIG. 17C is a bottom view of the second parts 22 of the light-emitting diode package according to the present disclosure. It is noted here, in the foregoing preferred embodiments, the surrounding 221 of the second part 22 may be formed in a period-repeating wriggle shape. Please further refer to FIG. 17D, FIG. 17D is a bottom view of the second parts 22 of the light-emitting diode package according to the present disclosure. It is noted here, in the foregoing preferred embodiments, the surrounding 221 of the second part 22 may be formed in an irregular wriggle shape.

Figure 18:
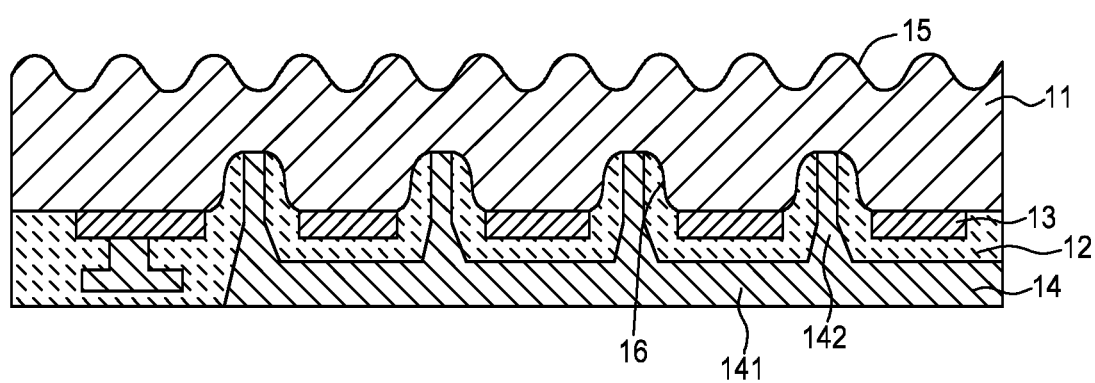
FIG. 18 is a cross sectional view of the LED chip of the light-emitting diode package according to the present disclosure.

FIG. 18 is a cross sectional view of the LED chip of the light-emitting diode package according to the present disclosure. It is noted here, in the foregoing preferred embodiments, the LED chip 1 includes a light-emitting layer 11, an isolating layer 12, a plurality of n-type electrodes 13 and a p-type electrode 14. The light-emitting layer 1 has a rough surface 15. A plurality of recesses 16 is formed at one surface corresponding to the rough surface 15 of the light-emitting layer 1. The p-type electrode 14 has a main body 141. A plurality of protrusions 142 is integrated with the main body 141. Each of the recesses 16 of the light-emitting layer 1 accommodates each of the protrusions 142 of the p-type electrode 14. Each of the n-type electrodes 13 is arranged under the light-emitting layer 1. Still, each of the n-type electrodes 13 is arranged next to one or more protrusions 142. The isolating layer 12 is arranged to cover the n-type electrodes 13 and the p-type electrode 14, and formed between the n-type electrodes 13 and the p-type electrode 14. As a result, the n-type electrodes 13 are isolated from the p-type electrode 14. The isolating layer 12 is filled in each of the recesses 16 in a direction from central to outside. The foregoing structure design to the light-emitting layer 11, the isolating layer 12, the n-type electrodes 13 and the p-type electrode 14 is an example.

The light-emitting diode package according to the embodiments of the present disclosure at least has the following advantages:

1. Each of the bumps of the light-emitting diode package according to the present disclosure has a first part and second part, the horizontal width of the first part is larger than the horizontal width of the second part, and a gap is formed between the bumps. In other words, the distance between the bumps is small, which results in a less stress being concentrated at the space between the bumps, as a result, a crack is difficultly caused by the stress to the thin film LED package. While being manufactured, the yield rate of thin film LED package is improved since there is almost no crack to reduce the yield rate.
2. The lateral surface/edge of the first part of one bump is formed together with the adjacent lateral surface/edge of the first part of the other bump in a period-repeating wriggle shape or an irregular wriggle shape, so that the structural strength between the bumps and the covering part is enhanced. In addition, the surrounding of the first part, the adjacent lateral surfaces/edges of one second part and the other adjacent second part, and the surrounding of the second part may be formed in a period-repeating wriggle shape or an irregular wriggle shape, as a result, the structural strength between the bumps and the covering part is further reinforced.
3. While being used, the protecting part may protect the light-emitting diode package from being damaged by a thimble.

While the present disclosure has been described above by way of examples and in terms of the preferred embodiments, it is to be recognized and understood that the present disclosure is not limited to the disclosed embodiments, it is intended to cover various modifications and similar arrangements as may be made thereto, and the scope of the appended claims should be accorded the broadest interpretation so as to encompass all such modifications which may fall within the spirit and the disclosure.

What is claimed is:

1. A light-emitting diode package, comprising:
an LED chip, comprising a lateral surface;
a pair of bumps, arranged under the LED chip without extending out from the lateral surface, and separated from each other by a first gap and a second gap, each bump of the pair of bumps including a first part and a second part placed under the first part, the first gap is between the first parts, the second gap is between the second parts, and the first gap is smaller than the second gap;
a protecting part, connected to the LED chip and separated from the pair of bumps by an annular gap; and
a covering part, surrounding the pair of bumps;
wherein each of the first parts has a first horizontal width, and each of the second parts has a second horizontal width smaller than the corresponding first horizontal width, and
wherein the first parts and the second parts are made of metals, each of the first parts has a first lateral surface facing to the first gap, each of the second parts has a second lateral surface facing to the second gap, the first lateral surface has a wriggle shape, the second lateral surface has a flat shape.

2. The light-emitting diode package according to claim 1, wherein the wriggle shape of the first lateral surface is a period-repeating wriggle shape or an irregular wriggle shape.

3. The light-emitting diode package according to claim 1, wherein the pair of bumps comprises Cu, Ni, Cr, Sn or Ag.

4. The light-emitting diode package according to claim 1, wherein the first gap has a width which is between 1 µm and 30 µm, each of the first parts has a vertical height, and a ratio of the width to the vertical height is between 0.5 and 2.0.

5. The light-emitting diode package according to claim 1, wherein each of the first parts has a surrounding formed in a period-repeating wriggle shape.

6. The light-emitting diode package according to claim 1, wherein each of the first parts has a surrounding formed in an irregular wriggle shape.

7. The light-emitting diode package according to claim 1, wherein each of the first parts has a first thickness, each of the second parts has a second thickness thicker than the corresponding first thickness.

8. The light-emitting diode package according to claim 1, wherein the covering part fully contacts the first lateral surface and the second lateral surface.

9. The light-emitting diode package according to claim 1, wherein the protecting part is covered by the covering part.

10. The light-emitting diode package according to claim 1, wherein the protecting part has a bottom surface covered by the covering part.

11. The light-emitting diode package according to claim 10, wherein the pair of bumps has a bottommost surface, the bottom surface has an elevation higher than that of the bottommost surface.

12. The light-emitting diode package according to claim 1, wherein the protecting part has a shape of rectangle.

13. The light-emitting diode package according to claim 1, wherein in a bottom view, the protecting part has an area smaller than that of each of the second parts.

14. The light-emitting diode package according to claim 1, wherein each of the first parts has a first outer lateral surface opposite to the first gap, the first outer lateral surface is flat.

15. The light-emitting diode package according to claim 1, wherein the covering part is filled in the second gap.

16. The light-emitting diode package according to claim 1, wherein the lateral surface is not covered by the covering part.

17. The light-emitting diode package according to claim 16, wherein the lateral surface is coplanar with the covering part.

* * * * *